(12) United States Patent
Kanzaki et al.

(10) Patent No.: US 9,196,742 B2
(45) Date of Patent: Nov. 24, 2015

(54) THIN FILM TRANSISTOR SUBSTRATE, METHOD FOR MANUFACTURING THE SAME, AND LIQUID CRYSTAL DISPLAY PANEL

(75) Inventors: Yohsuke Kanzaki, Osaka (JP); Yuhichi Saitoh, Osaka (JP); Yoshiki Nakatani, Osaka (JP); Tetsuya Okamoto, Osaka (JP); Yudai Takanishi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 124 days.

(21) Appl. No.: 13/813,839

(22) PCT Filed: Jul. 28, 2011

(86) PCT No.: PCT/JP2011/004300
§ 371 (c)(1),
(2), (4) Date: Feb. 13, 2013

(87) PCT Pub. No.: WO2012/017626
PCT Pub. Date: Feb. 9, 2012

(65) Prior Publication Data
US 2014/0028944 A1    Jan. 30, 2014

(30) Foreign Application Priority Data
Aug. 4, 2010   (JP) .................................. 2010-175191

(51) Int. Cl.
*H01L 29/786*   (2006.01)
*G02F 1/1368*   (2006.01)
(Continued)

(52) U.S. Cl.
CPC .......... *H01L 29/7869* (2013.01); *G02F 1/1368* (2013.01); *H01L 27/1225* (2013.01);
(Continued)

(58) Field of Classification Search
CPC .............. G02F 1/1368; H01L 27/1225; H01L 29/66969; H01L 27/1288; H01L 29/7869; H01L 27/1255; H01L 29/66742
USPC .................... 349/39, 43, 187; 257/43, 59, 72; 438/30; 345/92
See application file for complete search history.

(56) References Cited

U.S. PATENT DOCUMENTS

2001/0041394 A1   11/2001   Park et al.
2002/0197539 A1   12/2002   Park et al.
(Continued)

FOREIGN PATENT DOCUMENTS

JP   2001-319876 A   11/2001
JP   2010-032737 A   2/2010
(Continued)

OTHER PUBLICATIONS

Official Communication issued in International Patent Application No. PCT/JP2011/004300, mailed on Aug. 30, 2011.

*Primary Examiner* — Dung Nguyen
*Assistant Examiner* — Tai Duong
(74) *Attorney, Agent, or Firm* — Keating & Bennett, LLP

(57) ABSTRACT

A TFT substrate (20a) includes a plurality of pixel electrodes (17a) provided in a matrix, a plurality of TFTs (5) each provided for a corresponding one of the pixel electrodes (17a), and a plurality of auxiliary capacitors (6a) each provided for a corresponding one of the pixel electrodes (17a). Each of the auxiliary capacitors (6a) includes a capacitor line (11b) made of a material identical to that of the gate electrode (11aa) of the TFT (5) and provided in a layer identical to that of the gate electrode (11aa) of the TFT (5), the gate insulating film (12) provided so as to cover the capacitor line (11b), and a corresponding one of the pixel electrodes (17a) provided on the gate insulating film (12) so as to overlap with the capacitor line (11b) and being in conduction with a drain electrode (14ca).

8 Claims, 9 Drawing Sheets

(51) Int. Cl.
*H01L 27/12* (2006.01)
*H01L 29/66* (2006.01)

(52) U.S. Cl.
CPC ........ *H01L27/1255* (2013.01); *H01L 27/1288* (2013.01); *H01L 29/66742* (2013.01); *H01L 29/66969* (2013.01)

(56) References Cited

U.S. PATENT DOCUMENTS

2010/0039577 A1* 2/2010 Hirato .............................. 349/54

2010/0127266 A1 5/2010 Saito et al.
2012/0058601 A1 3/2012 Saito et al.
2012/0132909 A1 5/2012 Saito et al.

FOREIGN PATENT DOCUMENTS

| | | | |
|---|---|---|---|
| JP | 2010-123748 A | | 6/2010 |
| JP | 2010-139539 A | | 6/2010 |
| JP | 2010-145875 A | | 7/2010 |
| WO | WO 2011/080879 | * | 7/2011 |

* cited by examiner (a)

(b)

(c)

(a)

(b)

(c)

(a)

(b)

(c)

(a)

(b)

(c)

THIN FILM TRANSISTOR SUBSTRATE, METHOD FOR MANUFACTURING THE SAME, AND LIQUID CRYSTAL DISPLAY PANEL

TECHNICAL FIELD

The present invention relates to a thin film transistor substrate, a manufacturing method thereof, and a liquid crystal display panel. In particular, the present invention relates to a thin film transistor substrate including auxiliary capacitors, a manufacturing method thereof, and a liquid crystal display panel.

BACKGROUND ART

An active matrix liquid crystal display panel includes a thin film transistor (hereinafter referred to as a "TFT") substrate in which, e.g., a TFT is provided as a switching element at each pixel which is the minimum unit of an image, a counter substrate arranged so as to face the TFT substrate, and a liquid crystal layer sealed between the foregoing substrates. In the TFT substrate, an auxiliary capacitor is provided at each pixel in order to stably retain an electric charge on part of the liquid crystal layer corresponding to each pixel, i.e., a liquid crystal capacitor. The TFT includes, e.g., a gate electrode provided on a substrate, a gate insulating film provided so as to cover the gate electrode, a semiconductor layer provided on the gate insulating film and arranged so as to overlap with the gate electrode, and source and drain electrodes provided on the semiconductor layer and arranged apart from each other. The auxiliary capacitor includes, e.g., a capacitor line provided on the substrate, the gate insulating film provided so as to cover the capacitor line, and a capacitor electrode (e.g., a drain electrode of the TFT) provided on the gate insulating film and arranged so as to overlap with the capacitor line.

For example, Patent Document 1 discloses a method for manufacturing a TFT substrate. In such a method, a gate insulating film, a semiconductor layer (film forming the semiconductor layer), a contact layer (film forming a contact layer pattern), and a conductive layer are vapor-deposited in this order so as to cover gate lines, gate electrodes, and storage electrodes which are formed on an insulating substrate. After a photosensitive film is formed on the conductive layer by two times of light exposure, the semiconductor layer (film forming the semiconductor layer), the contact layer (film forming the contact layer pattern), and the conductive layer are etched in two steps by using the photosensitive film. Then, data lines, source electrodes, the semiconductor layer, the contact layer pattern, drain electrodes, and a storage capacitor conductive pattern are formed.

CITATION LIST

Patent Document

PATENT DOCUMENT 1: Japanese Patent Publication No. 2001-319876

SUMMARY OF THE INVENTION

Technical Problem

In the TFT substrate manufactured by the manufacturing method disclosed in Patent Document 1, a storage capacitor corresponding to the auxiliary capacitor has a multilayer structure of the storage electrode, the gate insulating film, a storage capacitor semiconductor layer, a storage capacitor contact layer pattern, and the storage capacitor conductive pattern. In a TFT substrate manufacturing method in which a step of forming a semiconductor layer, source electrodes, and drain electrodes by using a photo mask is simplified, the semiconductor layer is, as in the manufacturing method disclosed in Patent Document 1, positioned below the source electrodes and the drain electrodes, and therefore the semiconductor layer is stacked below a capacitor electrode (drain electrode) serving as an auxiliary capacitor. In such a case, not only a gate insulating film but also the semiconductor layer function as dielectric layers in an auxiliary capacitor having a multilayer structure of a capacitor line, the gate insulating film, the semiconductor layer, and the drain electrode. Thus, a change in electrical capacitance due to a metal oxide semiconductor (MOS) structure occurs between the gate insulating film and the semiconductor layer. For such reasons, in a liquid crystal display panel configured to control the potential of pixel electrodes through auxiliary capacitors and having, e.g., a multi-pixel structure of a light sub-pixel and a dark sub-pixel at each pixel, the potential of the pixel electrodes is not controlled at a predetermined potential, resulting in occurrence of display defects such as flicker.

The present invention has been made in view of the foregoing, and it is an objective of the present invention to reduce a change in electrical capacitance of an auxiliary capacitor due to a semiconductor layer.

Solution to the Problem

In order to accomplish the foregoing objective, the present invention is configured such that pixel electrodes are provided on a gate insulating film covering capacitor lines.

Specifically, a thin film transistor substrate of the present invention includes a plurality of pixel electrodes provided in a matrix; a plurality of thin film transistors each provided for a corresponding one of the pixel electrodes and connected to the corresponding one of the pixel electrodes; and a plurality of auxiliary capacitors each provided for a corresponding one of the pixel electrodes. Each of the thin film transistors includes a gate electrode provided on or above a substrate, a gate insulating film provided so as to cover the gate electrode, a semiconductor layer provided on the gate insulating film and having a channel region such that the channel region overlaps with the gate electrode, and source and drain electrodes provided on the semiconductor layer and arranged apart from each other with the channel region being interposed therebetween, the channel region being exposed through the source and drain electrodes. Each of the auxiliary capacitors includes a capacitor line made of a material identical to that of the gate electrode and provided in a layer identical to that of the gate electrode, the gate insulating film provided so as to cover the capacitor line, and a corresponding one of the pixel electrodes provided on the gate insulating film so as to overlap with the capacitor line and being in conduction with the drain electrode.

According to the foregoing configuration, since the source and drain electrodes through which the channel region is exposed and which are arranged apart from each other with the channel region being interposed therebetween are provided on the semiconductor layer, the thin film transistor substrate is specifically configured in a manner that a semiconductor layer and source and drain electrodes are formed by using a photo mask. In the thin film transistor substrate, each of the auxiliary capacitors includes the capacitor line made of the material identical to that of the gate electrode and provided in the layer identical to that of the gate electrode, the gate insulating film provided so as to cover the capacitor line, and the pixel electrode provided on the gate insulating film so as to overlap with the capacitor line. Thus, the area of part of the semiconductor layer overlapping with the capacitor line with the gate insulating film being interposed therebetween is reduced. This reduces a change in electrical capacitance due to a MOS structure, and therefore a change in electrical capacitance of the auxiliary capacitor due to the semiconductor layer is reduced.

The drain electrode may be provided so as to overlap with the capacitor line, and may have, in part overlapping with the capacitor line, a non-patterned part through which the gate insulating film is exposed. Each of the pixel electrodes may be provided on the gate insulating film with the non-patterned part being interposed therebetween.

According to the foregoing configuration, since each of the pixel electrodes is provided on the gate insulating film with the non-patterned part of the drain electrode being interposed therebetween, the area of part of the semiconductor layer overlapping with the capacitor line with the gate insulating film being interposed therebetween is reduced by the non-patterned part of the drain electrode. Thus, the change in electrical capacitance due to the MOS structure is specifically reduced.

The non-patterned part may be an opening formed in the drain electrode.

According to the foregoing configuration, since the non-patterned part of the drain electrode is the opening formed in the drain electrode (e.g., an end part of the drain electrode), the area of part of the semiconductor layer overlapping with the capacitor line with the gate insulating film being interposed therebetween is reduced by the opening of the drain electrode. Thus, the change in electrical capacitance due to the MOS structure is specifically reduced.

The drain electrode may be provided apart from the capacitor line as viewed in plane.

According to the foregoing configuration, since the drain electrode is provided apart from the capacitor line as viewed in the plane, the drain electrode does not overlap with the capacitor line. Thus, the area of part of the semiconductor layer overlapping with the capacitor line with the gate insulating film being interposed therebetween is zero. Consequently, the change in electrical capacitance due to the MOS structure is reduced, and a change in electrical capacitance of the auxiliary capacitor due to the semiconductor layer is reduced. Moreover, since, e.g., the area of the drain electrode made of a metal layer having light blocking properties is reduced at each pixel, an aperture ratio at each pixel can be improved.

The semiconductor layer may be made of an oxide semiconductor.

According to the foregoing configuration, since the semiconductor layer is made of the oxide semiconductor, the thin film transistor having favorable properties such as high mobility, high reliability, and low off-current can be realized.

The present invention is intended for a method for manufacturing a thin film transistor substrate including a plurality of pixel electrodes provided in a matrix; a plurality of thin film transistors each provided for a corresponding one of the pixel electrodes and connected to the corresponding one of the pixel electrodes; and a plurality of auxiliary capacitors each provided for a corresponding one of the pixel electrodes, in which each of the thin film transistors includes a gate electrode provided on or above a substrate, a gate insulating film provided so as to cover the gate electrode, a semiconductor layer provided on the gate insulating film and having a channel region such that the channel region overlaps with the gate electrode, and source and drain electrodes provided on the semiconductor layer and arranged apart from each other with the channel region being interposed therebetween, the channel region being exposed through the source and drain electrodes. The method includes a gate layer formation step of forming the gate electrode and a capacitor line on the substrate; a resist pattern formation step of forming, after the gate insulating film, a semiconductor film, and a metal conductive film are formed in this order so as to cover the gate electrode and the capacitor line, a resist pattern on a region of the metal conductive film where the channel region and the source and drain electrodes are to be formed such that a region to be the channel region is formed thinner; a first etching step of etching part of the metal conductive film exposed through the resist pattern and part of the semiconductor film arranged below the metal conductive film to form a source drain formation layer which is to be the channel region and the source and drain electrodes; a second etching step of etching, after the resist pattern used in the first etching step is reformed in a manner that a thickness thereof is reduced such that a region of the source drain formation layer which is to be the channel region is exposed, part of the metal conductive film exposed through the reformed resist pattern to form the semiconductor layer having the channel region and the source and drain electrodes, thereby forming each of the thin film transistors; a protection insulating film formation step of forming, after the resist pattern used in the second etching step is removed, a protection insulating film such that a contact hole reaching the drain electrode is formed and part overlapping the capacitor line is exposed; and a pixel electrode formation step of forming each of the pixel electrodes on the protection insulating film such that the each of the pixel electrodes overlaps with the capacitor line with the gate insulating film being interposed therebetween, thereby forming a corresponding one of the auxiliary capacitors.

According to the foregoing method, the four photo masks are used as follows to manufacture the thin film transistor substrate including the auxiliary capacitors. In the gate layer formation step, e.g., a first photo mask is used to form the gate electrode and the capacitor line on the substrate. In the resist pattern formation step, the gate insulating film, the semiconductor film, and the metal conductive film are formed in this order so as to cover the gate electrode and the capacitor line, and then, e.g., a second photo mask (mask which is a halftone mask for light exposure) is used to form the resist pattern on the metal conductive film. In the first etching step, part of the metal conductive film exposed through the resist pattern and part of the semiconductor film are etched to form the source drain formation layer. In the second etching step, part of the metal conductive film of the source drain formation layer exposed by reducing the thickness of part of the resist pattern is etched to form the semiconductor layer having the channel region, the source and drain electrodes. In the foregoing manner, the thin film transistor is formed. In the protection insulating film formation step, e.g., a third photo mask is used to form the protection insulating film in which the contact hole reaching the drain electrode of the thin film transistor is formed and part overlapping with the capacitor line is exposed. In the pixel electrode formation step, e.g., a fourth photo mask is used to form the pixel electrode. In the foregoing manner, the auxiliary capacitor is formed. In the manufactured thin film transistor substrate, each of the auxiliary capacitors includes the capacitor line provided in a layer identical to that of the gate electrode and made of a material identical to that of the gate electrode, the gate insulating film provided so as to cover the capacitor line, and the pixel electrode provided on the gate insulating film so as to overlap with the capacitor line. Thus, the area of part of the semiconductor layer overlapping with the capacitor line with the gate insulating film being interposed therebetween can be reduced. This reduces the change in electrical capacitance due to the MOS structure, and therefore the change in electrical capacitance of the auxiliary capacitor due to the semiconductor layer can be reduced.

A liquid crystal display panel of the present invention includes a thin film transistor substrate and a counter substrate provided so as to face each other; and a liquid crystal layer provided between the thin film transistor substrate and the counter substrate. The thin film transistor substrate includes a plurality of pixel electrodes provided in a matrix, a plurality of thin film transistors each provided for a corresponding one of the pixel electrodes and connected to the corresponding one of the pixel electrodes, and a plurality of auxiliary capacitors each provided for a corresponding one of the pixel electrodes. Each of the thin film transistors includes a gate electrode provided on or above a substrate, a gate insulating film provided so as to cover the gate electrode, a semiconductor layer provided on the gate insulating film and having a channel region such that the channel region overlaps with the gate electrode, and source and drain electrodes provided on the semiconductor layer and arranged apart from each other with the channel region being interposed therebetween, the channel region being exposed through the source and drain electrodes. Each of the auxiliary capacitors includes a capacitor line made of a material identical to that of the gate electrode and provided in a layer identical to that of the gate electrode, the gate insulating film provided so as to cover the capacitor line, and a corresponding one of the pixel electrodes provided on the gate insulating film so as to overlap with the capacitor line and being in conduction with the drain electrode.

According to the foregoing configuration, since the source and drain electrodes through which the channel region is exposed and which are arranged apart from each other with the channel region being interposed therebetween are provided on the semiconductor layer in the thin film transistor substrate, the thin film transistor substrate is specifically configured in the manner that the semiconductor layer and the source and drain electrodes are formed by using the photo mask. In the thin film transistor substrate, each of the auxiliary capacitors includes the capacitor line made of the material identical to that of the gate electrode and provided in the layer identical to that of the gate electrode, the gate insulating film provided so as to cover the capacitor line, and the pixel electrode provided on the gate insulating film so as to overlap with the capacitor line. Thus, the area of part of the semiconductor layer overlapping with the capacitor line with the gate insulating film being interposed therebetween is reduced. This reduces the change in electrical capacitance due to the MOS structure. Thus, in the thin film transistor substrate, the change in electrical capacitance of the auxiliary capacitor due to the semiconductor layer is reduced. Moreover, in the liquid crystal display panel including the thin film transistor substrate, occurrence of display defects such as flicker is reduced.

Advantages of the Invention

According to the present invention, since the pixel electrodes are provided on the gate insulating film covering the capacitor lines, the change in electrical capacitance of the auxiliary capacitor due to the semiconductor layer can be reduced.

DESCRIPTION OF EMBODIMENTS

Embodiments of the present invention will be described below in detail with reference to drawings. Note that the present invention is not limited to each of the embodiments described below.

<<First Embodiment of the Invention>>

Figure 1:
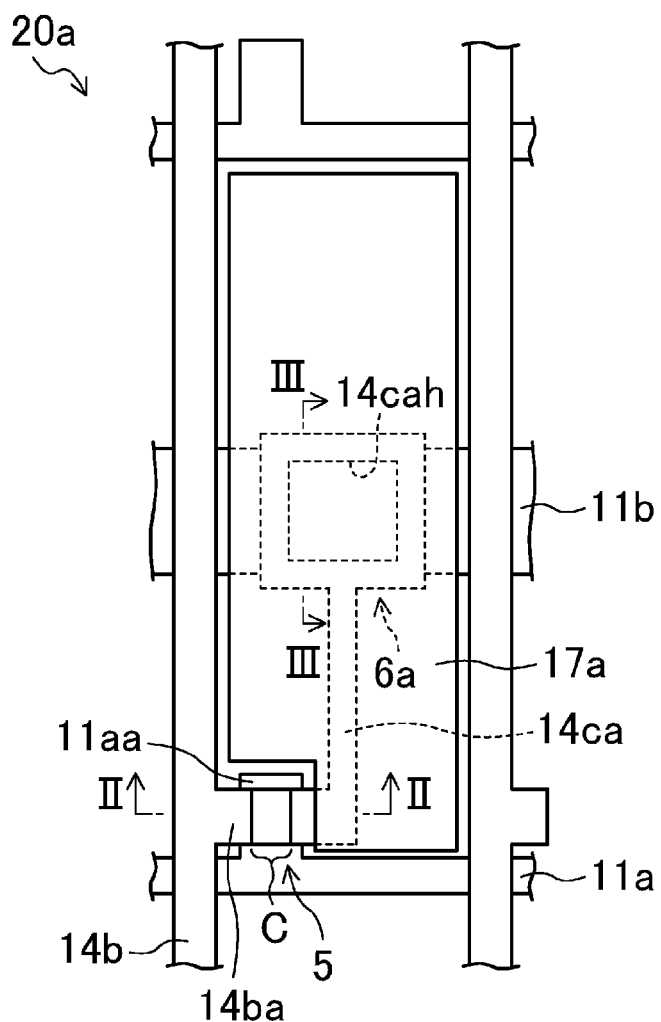
FIG. 1 is a plan view of a TFT substrate of a first embodiment.
Figure 2:
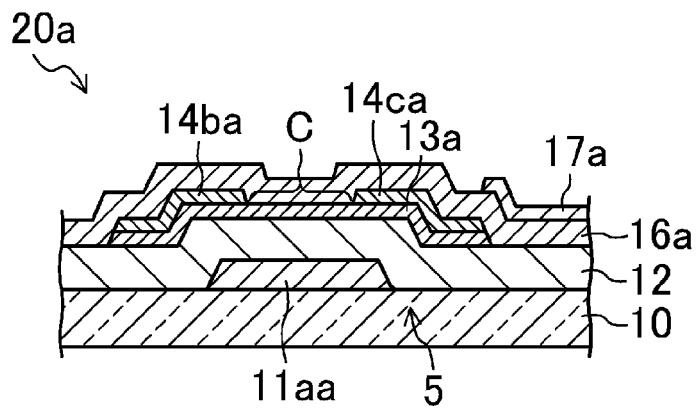
FIG. 2 is a cross-sectional view of the TFT substrate along an II-II line illustrated in FIG. 1.
Figure 3:
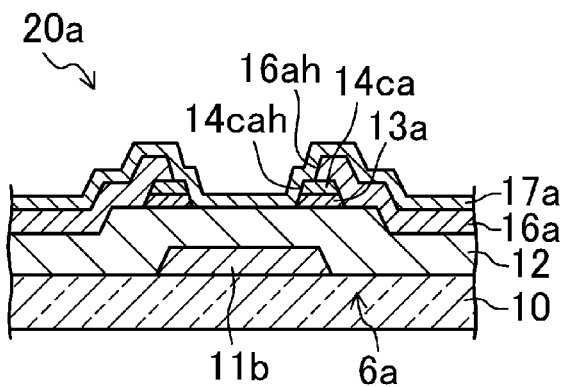
FIG. 3 is a cross-sectional view of the TFT substrate along an III-III line illustrated in FIG. 1.
Figure 4:
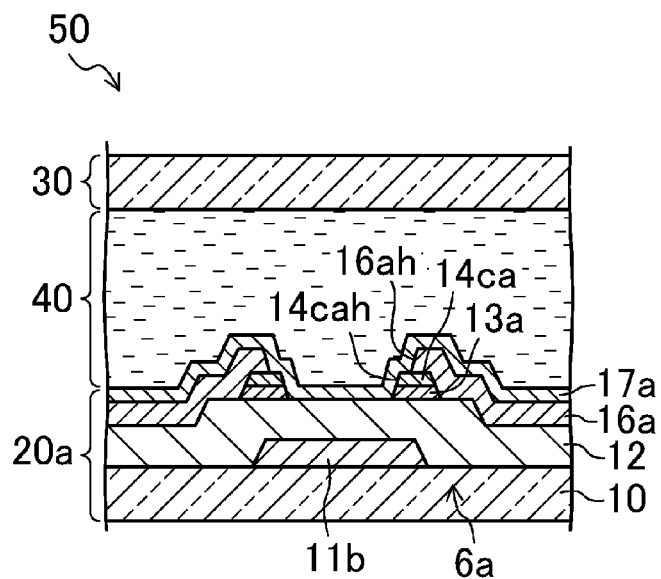
FIG. 4 is a cross-sectional view of a liquid crystal display panel including the TFT substrate of the first embodiment.
Figure 5:
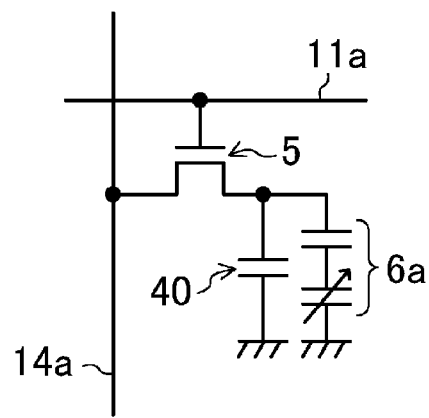
FIG. 5 is an equivalent circuit diagram of the TFT substrate of the first embodiment.
Figure 6:
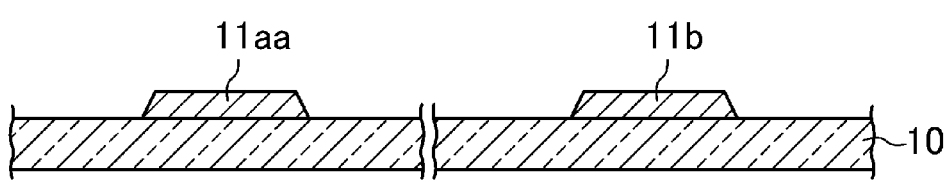
FIG. 6 is a first cross-sectional view illustrating steps of manufacturing the TFT substrate of the first embodiment.
Figure 6:
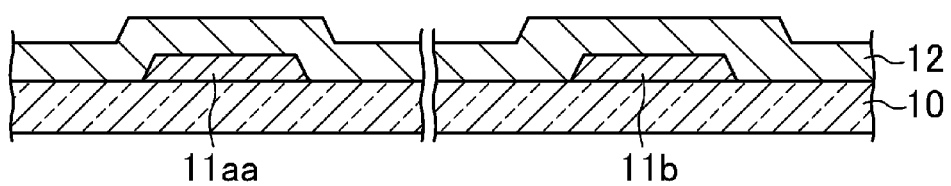
Figure 6:
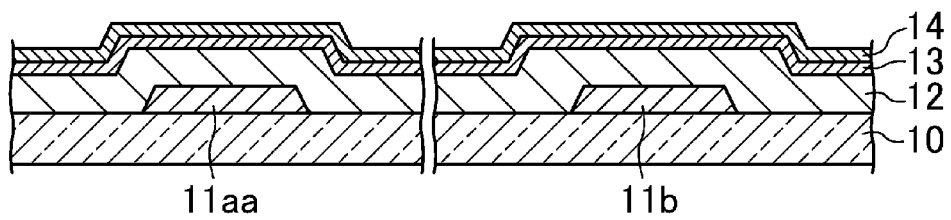
Figure 7:
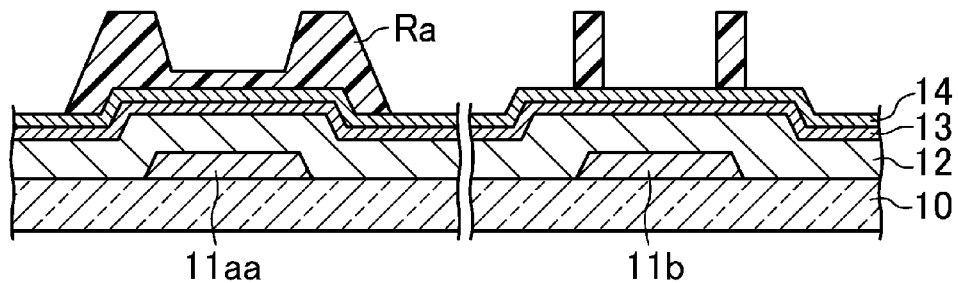
FIG. 7 is a second cross-sectional view illustrating steps of manufacturing the TFT substrate of the first embodiment after the steps illustrated in FIG. 6.
Figure 7:
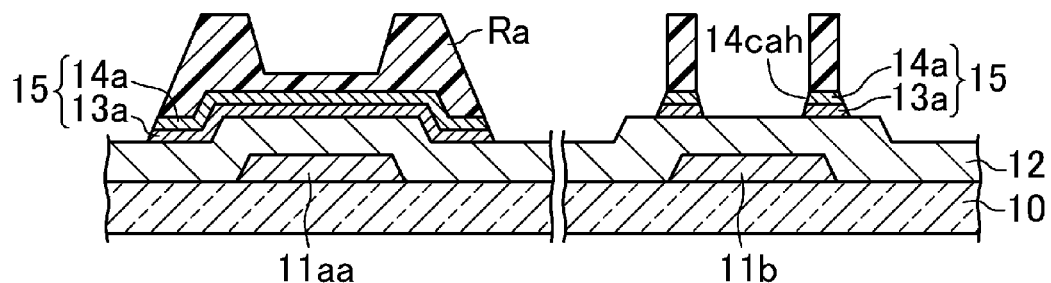
Figure 7:
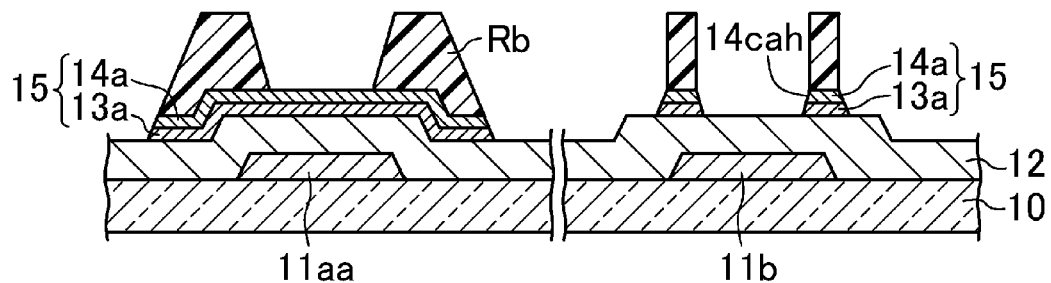
Figure 8:
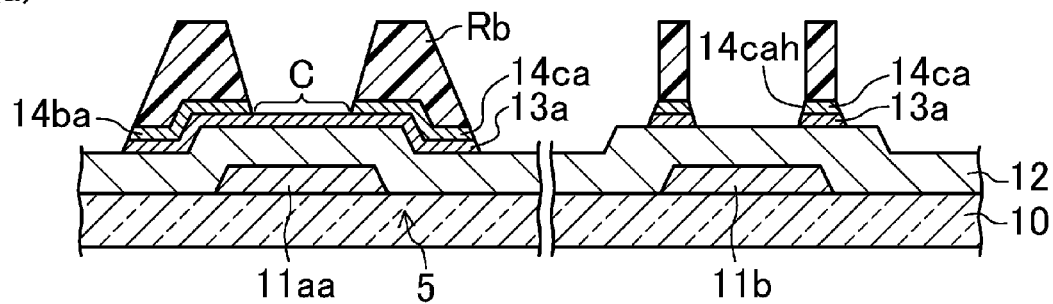
FIG. 8 is a third cross-sectional view illustrating steps of manufacturing the TFT substrate of the first embodiment after the steps illustrated in FIG. 7.
Figure 8:
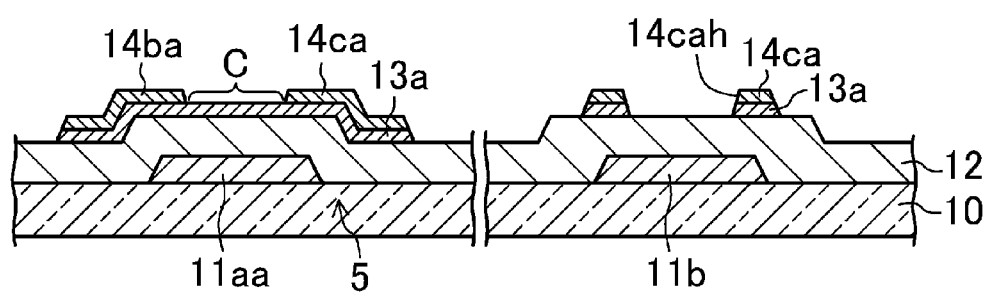
Figure 8:
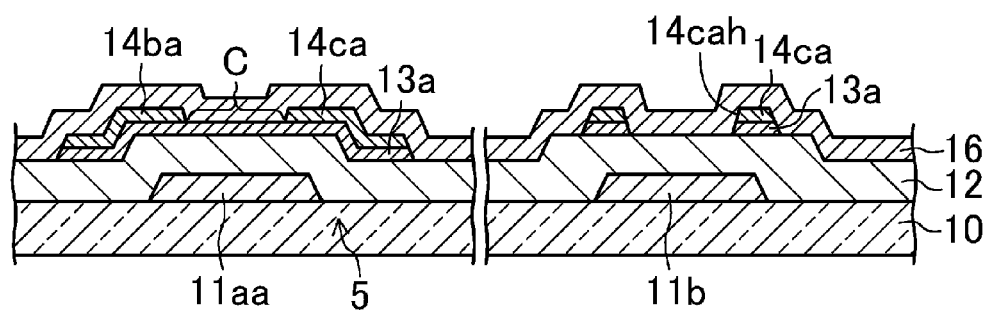
Figure 9:
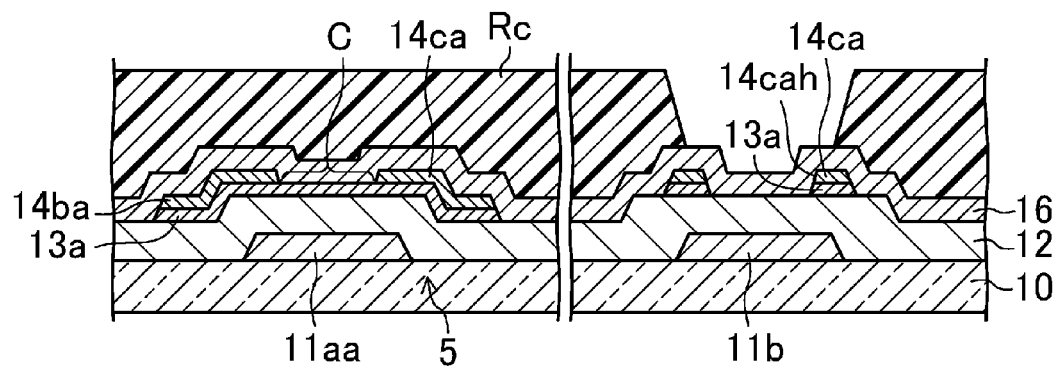
FIG. 9 is a fourth cross-sectional view illustrating steps of manufacturing the TFT substrate of the first embodiment after the steps illustrated in FIG. 8.
Figure 9:
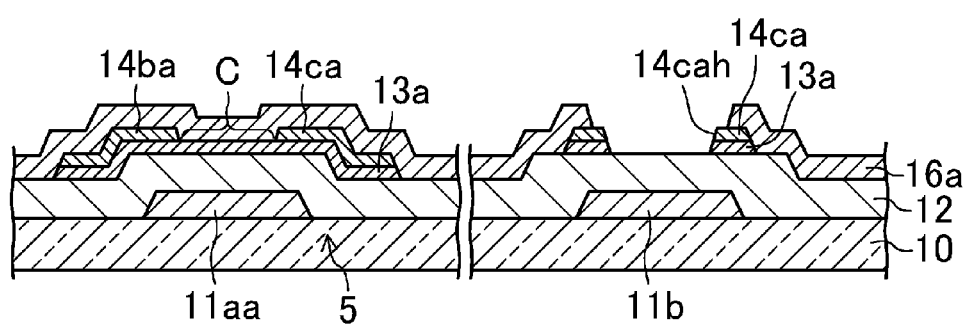
Figure 9:
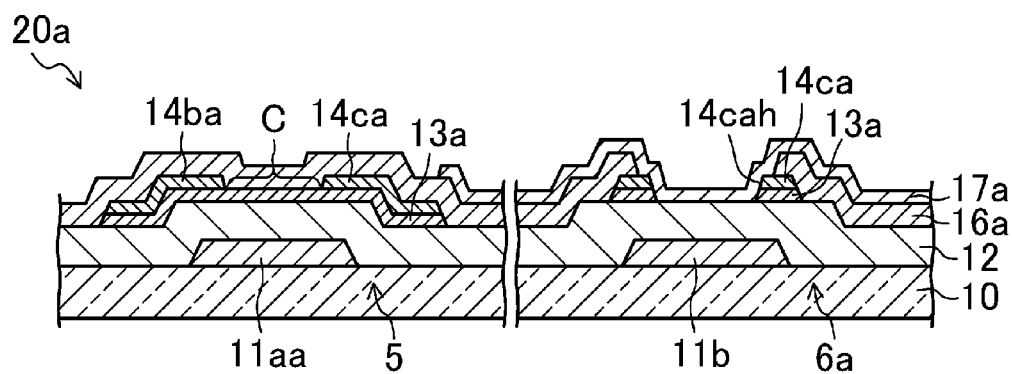

FIGS. 1-9 illustrate a TFT substrate, a manufacturing method thereof, and a liquid crystal display panel according to a first embodiment of the present invention. Specifically, FIG. 1 is a plan view of a TFT substrate 20a of the present embodiment. FIGS. 2 and 3 are cross-sectional views of the TFT substrate 20a respectively along an II-II line and an III-III line illustrated in FIG. 1. FIG. 4 is a cross-sectional view of a liquid crystal display panel 50 including the TFT substrate 20a. FIG. 5 is an equivalent circuit diagram of the TFT substrate 20a.

Referring to FIG. 4, the liquid crystal display panel 50 includes the TFT substrate 20a and a counter substrate 30 provided so as to face each other, a liquid crystal layer 40 provided between the TFT substrate 20a and the counter substrate 30, and a sealing material (not shown in the figure) bonding the TFT substrate 20a and the counter substrate 30 together and provided to seal the liquid crystal layer 40 between the TFT substrate 20a and the counter substrate 30.

Referring to FIGS. 1-5, the TFT substrate 20a includes the following: an insulating substrate 10; a plurality of gate lines 11a provided on the insulating substrate 10 so as to extend parallel to each other; a plurality of capacitor lines 11b each provided between adjacent ones of the gate lines 11a and arranged so as to extend parallel to each other; a plurality of source lines 14b provided so as to extend parallel to each other in a direction perpendicular to the gate lines 11a; a plurality of TFTs 5 each provided at an intersection between each of the gate lines 11a and each of the source lines 14b, i.e., at each pixel; a protection insulating film 16a provided so as to cover the TFTs 5; a plurality of pixel electrodes 17a provided in a matrix on the protection insulating film 16a; and an alignment film (not shown in the figure) provided so as to cover the pixel electrodes 17a.

Referring to FIGS. 1 and 2, each of the TFTs 5 includes the following: a gate electrode 11aa provided on the insulating substrate 10; a gate insulating film 12 provided so as to cover the gate electrode 11aa; a semiconductor layer 13a provided on the gate insulating film 12 and having a channel region C such that the channel region C overlaps with the gate electrode 11aa; and a source electrode 14ba and a drain electrode 14ca provided on the semiconductor layer 13a such that the channel region C is exposed and arranged apart from each other.

Referring to FIG. 1, the gate electrode 11aa is a laterally-protruding part of the gate line 11a.

The semiconductor layer 13a is made of an In—Ga—Zn—O based oxide semiconductor such as $InGaZnO_4$ or $In_2Ga_2ZnO_7$.

Referring to FIG. 1, the source electrode 14ba is a laterally-protruding part of the source line 14b.

Referring to FIGS. 1 and 3, the drain electrode 14ca is provided such that an end part thereof overlaps with the capacitor line 11b, and an opening 14cah is formed as a non-patterned part in part of the drain electrode 14ca overlapping with the capacitor line 11b. In addition, an edge part of the opening 14cah of the drain electrode 14ca is, referring to FIG. 3, connected to the pixel electrode 17a through a contact hole 16ah formed in the protection insulating film 16a.

Referring to FIGS. 1 and 3, the pixel electrode 17a forms an auxiliary capacitor 6a in the state in which the pixel electrode 17a overlaps with the capacitor line 11b with the gate insulating film 12 being interposed therebetween. The auxiliary capacitor 6a includes, referring to FIG. 5, a fixed capacitor part (see an upper part of the auxiliary capacitor 6a in FIG. 5) in which the capacitor line 11b and the pixel electrode 17a overlap with each other with only the gate insulating film 12 being interposed therebetween, and a variable capacitor part (a lower part of the auxiliary capacitor 6a in FIG. 5) having a MOS structure in which the capacitor line 11b and the pixel electrode 17a overlap with each other with the gate insulating film 12, the semiconductor layer 13a, and the drain electrode 14ca being interposed therebetween.

The counter substrate 30 includes an insulating substrate (not shown in the figure), a black matrix (not shown in the figure) provided in a grid pattern on the insulating substrate, a color filter (not shown in the figure) in which, e.g., each of red layers, green layers, and blue layers is provided between adjacent ones of grids of the black matrix, a common electrode (not shown in the figure) provided so as to cover the black matrix and the color filter, and an alignment film (not shown in the figure) provided so as to cover the common electrode.

The liquid crystal layer 40 is made of, e.g., a nematic liquid crystal material having electro-optical properties.

The liquid crystal display panel 50 having the foregoing configuration is configured as follows. For each pixel, an alignment state of the liquid crystal layer 40 is changed by applying predetermined voltage to the liquid crystal layer 40 interposed between each of the pixel electrodes 17 of the TFT substrate 20a and the common electrode of the counter substrate 30. In such a manner, the transmittance of light passing through the panel is adjusted at each pixel, thereby displaying an image.

Next, a method for manufacturing the TFT substrate 20a of the present embodiment will be described with reference to FIGS. 6-9. FIGS. 6-9 are cross-sectional views illustrating a sequence of steps of manufacturing the TFT substrate 20a of the present embodiment. Specifically, a left region as viewed in FIGS. 6-9 corresponds to the cross-sectional view illustrated in FIG. 2, and a right region as viewed in FIGS. 6-9 corresponds to the cross-sectional view illustrated in FIG. 3. The manufacturing method of the present embodiment includes a gate layer formation step, a resist pattern formation step, a first etching step, a second etching step, a protection insulating film formation step, and a pixel electrode formation step.

<Gate Layer Formation Step>

A titanium film (having a thickness of about 30 nm), an aluminum film (having a thickness of about 300 nm), and a titanium film (having a thickness of about 150 nm) are, by, e.g., sputtering, formed in this order to form a multilayer metal film on the entirety of an insulating substrate 10 such as a glass substrate. Then, the multilayer metal film is patterned by using a first photo mask, thereby forming, referring to FIG. 6(a), a gate line 11a (see FIG. 1), a gate electrode 11aa, and a capacitor line 11b.

<Resist Pattern Formation Step>

First, a silicon oxide film (having a thickness of about 300 nm) etc. are, by, e.g., chemical vapor deposition (CVD), formed on the entirety of the substrate on which the gate line 11a, the gate electrode 11aa, and the capacitor line 11b are formed in the gate layer formation step. In such a manner, a gate insulating film 12 is formed as illustrated in FIG. 6(b).

Subsequently, referring to FIG. 6(c), an In—Ga—Zn—O based semiconductor film 13 such as $InGaZnO_4$ (having a thickness of about 50 nm) and a metal conductive film 14 in which a titanium film (having a thickness of about 100 nm) and an aluminum film (having a thickness of about 300 nm) are stacked in this order are, by, e.g., the sputtering, formed on the entirety of the substrate on which the gate insulating film 12 is formed.

A photosensitive resin film (having a thickness of about 2 μm) is formed on the entirety of the substrate on which the semiconductor film 13 and the metal conductive film 14 are formed. Then, the photosensitive resin film is exposed to light, developed, and baked by using a second photo mask which is a halftone or gray-tone mask for light exposure. In such a manner, a resist pattern Ra is formed as illustrated in FIG. 7(a). Referring to FIG. 7(a), on a region where a channel region C, a source electrode 14ba, and a drain electrode 14ca will be formed, the resist pattern Ra is formed such that part of the region which will be the channel region C is thinner than part of the region which will be the source electrode 14ba and the drain electrode 14ca.

<First Etching Step>

Part of the metal conductive film 14 exposed through the resist pattern Ra formed in the resist pattern formation step and part of the semiconductor film 13 formed below the metal conductive film 14 are etched by dry etching or wet etching. In such a manner, a source drain formation layer 15 made of a semiconductor layer 13a and a metal conductive film 14a is formed as illustrated in FIG. 7(b).

<Second Etching Step>

First, in such a manner that ashing of the resist pattern Ra used in the first etching step is performed by using, e.g., $O_2$ plasma, the thickness of part of the resist pattern Ra is, referring to FIG. 7(c), reduced such that the metal conductive film 14a of the source drain formation layer 15 is exposed. In this manner, the resist pattern Ra is formed into a resist pattern Rb.

Subsequently, in such a manner that part of the metal conductive film 14a exposed through the resist pattern Rb is etched by the dry etching or the wet etching, the semiconductor layer 13a having the channel region C, a source line 14b (see FIG. 1), the source electrode 14ba, and the drain electrode 14ca are formed as illustrated in FIG. 8(a). In this manner, a TFT 5 is formed.

<Protection Insulating Film Formation Step>

First, the resist pattern Rb is, referring to FIG. 8(b), peeled and removed from the substrate on which the TFT 5 is formed in the second etching step.

Subsequently, a silicon oxide film (having a thickness of about 250 nm) etc. are, by, e.g., the CVD, formed on the entirety of the substrate from which the resist pattern Rb is removed. In such a manner, an inorganic insulating film 16 is formed as illustrated in FIG. 8(c).

A photosensitive resin film (having a thickness of about 2 μm) is formed on the entirety of the substrate on which the inorganic insulating film 16 is formed. Then, the photosensitive resin film is exposed to light, developed, and baked by using a third photo mask, thereby forming a resist pattern Rc as illustrated in FIG. 9(a).

In such a manner that part of the inorganic insulating film 16 exposed through the resist pattern Rc is etching by, e.g., the dry etching or the wet etching, a protection insulating film 16a is formed as illustrated in FIG. 9(b). Then, the resist pattern Rc is peeled and removed.

<Pixel Electrode Formation Step>

A transparent conductive film such as an indium tin oxide (ITO) film (having a thickness of about 10 nm) is, by, e.g., the sputtering, formed on the entirety of the substrate on which the protection insulating film 16a is formed in the protection insulating film formation step. Then, the transparent conductive film is patterned by using a fourth photo mask, thereby forming a pixel electrode 17a as illustrated in FIG. 9(c).

In the foregoing manner, the TFT substrate 20a can be manufactured.

As described above, according to the TFT substrate 20a and the manufacturing method thereof in the present embodiment, the four photo masks are used as follows to manufacture the TFT substrate 20a including the auxiliary capacitors 6a. In the gate layer formation step, the first photo mask is used to form the gate electrode 11aa and the capacitor line 11b on the insulating substrate 10. In the resist pattern formation step, the gate insulating film 12, the semiconductor film 13, and the metal conductive film 14 are formed in this order so as to cover the gate electrode 11aa and the capacitor line 11b, and then the second photo mask which is the halftone mask for light exposure is used to form the resist pattern Ra on the metal conductive film 14. In the first etching step, part of the metal conductive film 14 exposed through the resist pattern Ra and part of the semiconductor film 13 are etched to form the source drain formation layer 15. In the second etching step, part of the metal conductive film 14a of the source drain formation layer 15 exposed by reducing the thickness of part of the resist pattern Ra is etched to form the semiconductor layer 13a having the channel region C, the source electrode 14ba, and the drain electrode 14ca. In the foregoing manner, the TFT 5 is formed. In the protection insulating film formation step, the third photo mask is used to form the protection insulating film 16a in which the contact hole 16ah reaching the drain electrode 14ca of the TFT 5 is formed and part overlapping with the capacitor line 11b is exposed. In the pixel electrode formation step, the fourth photo mask is used to form the pixel electrode 17a. In the foregoing manner, the auxiliary capacitor 6a is formed. In the manufactured TFT substrate 20a, each of the auxiliary capacitors 6a includes the capacitor line 11b provided in a layer identical to that of the gate electrode 11aa and made of a material identical to that of the gate electrode 11aa, the gate insulating film 12 provided so as to cover the capacitor line 11b, and the pixel electrode 17a provided on the gate insulating film 12 so as to overlap with the capacitor line 11b. Thus, the area of part of the semiconductor layer 13a overlapping with the capacitor line 11b with the gate insulating film 12 being interposed therebetween can be reduced. This reduces a change in electrical capacitance due to the MOS structure, and therefore a change in electrical capacitance of the auxiliary capacitor 6a due to the semiconductor layer 13a can be reduced.

According to the liquid crystal display panel 50 of the present embodiment, since the change in electrical capacitance of the auxiliary capacitor 6a due to the semiconductor layer 13a can be reduced in the TFT substrate 20a, occurrence of display defects such as flicker can be reduced.

According to the TFT substrate 20a of the present embodiment, since the semiconductor layer 13a is made of the oxide semiconductor, the TFT 5 having favorable properties such as high mobility, high reliability, and low off-current can be realized.

<<Second Embodiment of the Invention>>

Figure 10:
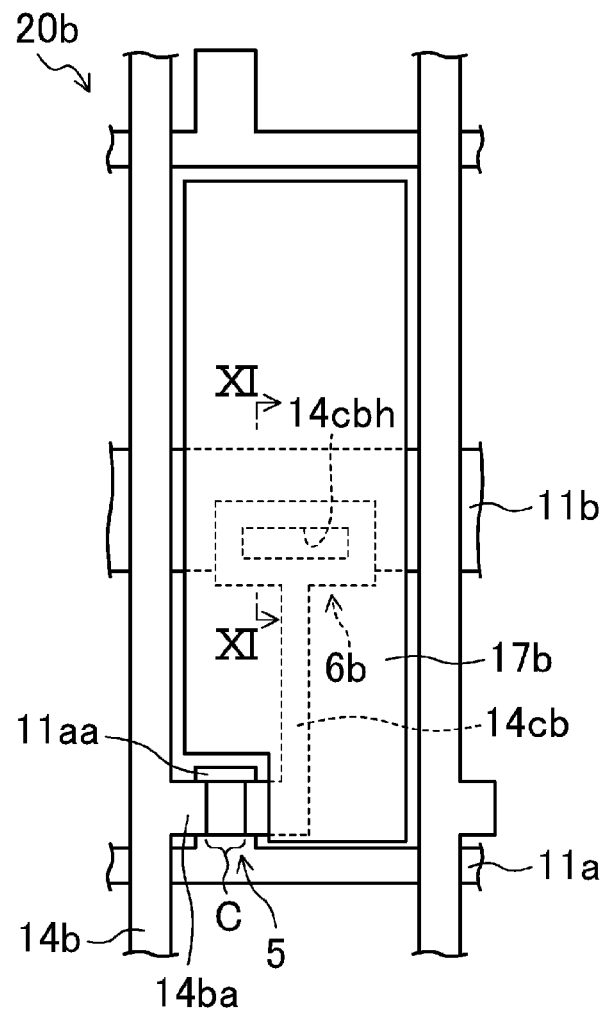
FIG. 10 is a plan view of a TFT substrate of a second embodiment.
Figure 11:
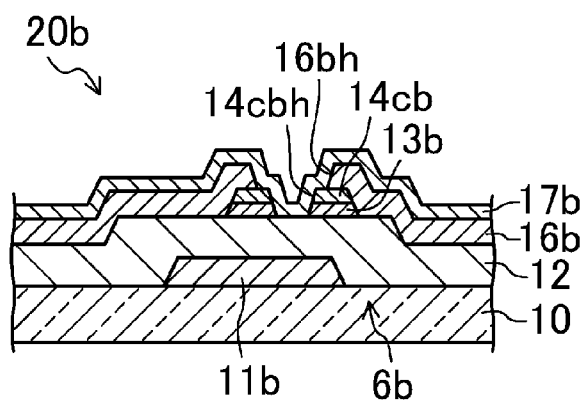
FIG. 11 is a cross-sectional view of the TFT substrate along a XI-XI line illustrated in FIG. 10.

FIG. 10 is a plan view of a TFT substrate 20b of the present embodiment. FIG. 11 is a cross-sectional view of the TFT substrate 20b along a XI-XI line illustrated in FIG. 10. Note that the same reference numerals as those shown in FIGS. 1-9 are used to represent equivalent elements in each of embodiments described below, and the description thereof will not be repeated.

In the first embodiment, the TFT substrate 20a in which the drain electrode 14ca is, at each pixel, arranged such that the entirety of the end part of the drain electrode 14ca overlaps with the capacitor line 11b has been described as an example. On the other hand, in the present embodiment, the TFT substrate 20b in which a drain electrode 14cb is, at each pixel, arranged such that an end part of the drain electrode 14cb partially overlaps with a capacitor line 11b will be described as an example.

Specifically, in the TFT substrate 20b, each of TFTs 5 includes, referring to FIGS. 10 and 11, a gate electrode 11aa provided on an insulating substrate 10, a gate insulating film 12 provided so as to cover the gate electrode 11aa, a semiconductor layer 13b provided on the gate insulating film 12 and having a channel region C such that the channel region C overlaps with the gate electrode 11aa, and a source electrode 14ba and the drain electrode 14cb provided on the semiconductor layer 13b such that the channel region C is exposed and arranged apart from each other.

Referring to FIGS. 10 and 11, in the TFT substrate 20b, a protection insulating film 16b is provided so as to cover each of the TFTs 5, and a plurality of pixel electrodes 17b are provided in a matrix on the protection insulating film 16b.

Referring to FIGS. 10 and 11, the drain electrode 14cb is provided such that the end part thereof overlaps with part (lower part as viewed in FIG. 10) of the capacitor line 11b, and an opening 14cbh is formed as a non-patterned part in part of the drain electrode 14cb overlapping with the capacitor line 11b. In addition, in the TFT substrate 20b, an edge part of the opening 14cbh of the drain electrode 14cb is, referring to FIGS. 10 and 11, connected to the pixel electrode 17b through a contact hole 16bh formed in the protection insulating film 16b. Referring to FIGS. 10 and 11, the pixel electrode 17b forms an auxiliary capacitor 6b in the state in which the pixel electrode 17b overlaps with the capacitor line 11b with the gate insulating film 12 being interposed therebetween. As in the auxiliary capacitor 6a of the first embodiment, the auxiliary capacitor 6b includes a fixed capacitor part in which the capacitor line 11b and the pixel electrode 17b overlap with each other with only the gate insulating film 12 being interposed therebetween, and a variable capacitor part having a MOS structure in which the capacitor line 11b and the pixel electrode 17b overlap with each other with the gate insulating film 12, the semiconductor layer 13b, and the drain electrode 14cb being interposed therebetween. Since the area of the opening 14cbh of the drain electrode 14cb overlapping with the capacitor line 11b is smaller in the auxiliary capacitor 6b than in the auxiliary capacitor 6a of the first embodiment, an electrical capacitance ratio of the variable capacitor part of the auxiliary capacitor 6b is higher than that of the auxiliary capacitor 6a of the first embodiment.

The TFT substrate 20b having the foregoing configuration can be manufactured in a manner that pattern shapes of, e.g., a source drain formation layer and a protection insulating film are changed from those of the manufacturing method described in the first embodiment.

As described above, according to the TFT substrate 20b and the manufacturing method thereof in the present embodiment, the pixel electrodes 17b are, as in the first embodiment, provided on the gate insulating film 12 covering the capacitor lines 11b, and therefore a change in electrical capacitance of the auxiliary capacitor 6b due to the semiconductor layer 13b can be reduced.

<<Third Embodiment of the Invention>>

Figure 12:
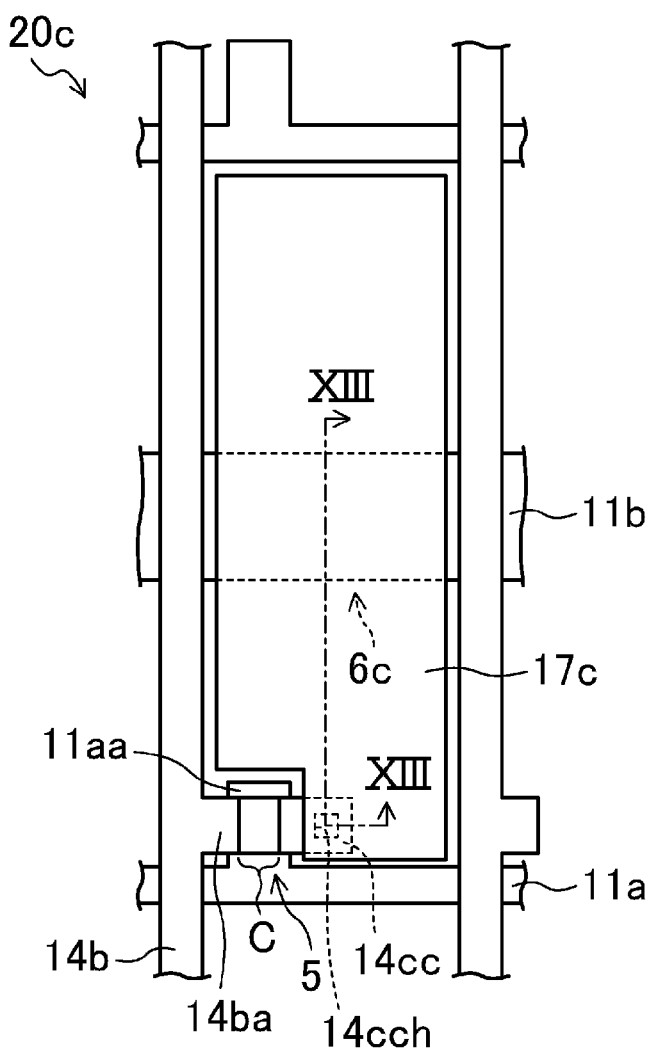
FIG. 12 is a plan view of a TFT substrate of a third embodiment.
Figure 13:
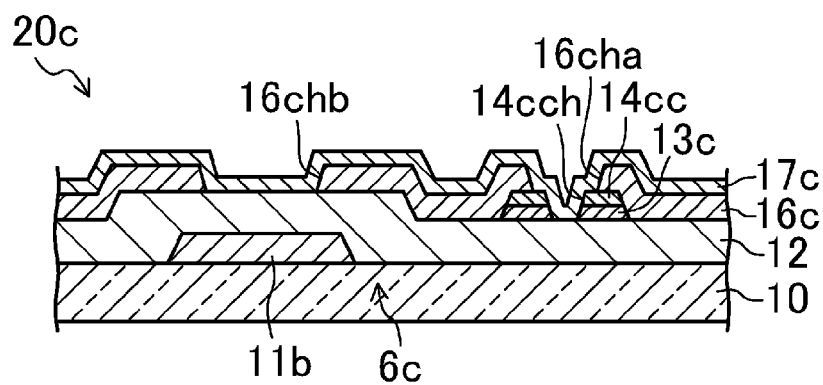
FIG. 13 is a cross-sectional view of the TFT substrate along a XIII-XIII line illustrated in FIG. 12.

FIG. 12 is a plan view of a TFT substrate 20c of the present embodiment. FIG. 13 is a cross-sectional view of the TFT substrate 20c along a XIII-XIII line illustrated in FIG. 12.

In the foregoing embodiments, the TFT substrate 20a in which the drain electrode 14ca is arranged so as to overlap with the capacitor line 11b and the TFT substrate 20b in which the drain electrode 14cb is arranged so as to overlap with the capacitor line 11b have been described as examples. On the other hand, in the present embodiment, the TFT substrate 20c in which a drain electrode 14cc is arranged so as not to overlap with a capacitor line 11b will be described as an example.

Specifically, in the TFT substrate 20c, each of TFTs 5 includes, referring to FIGS. 12 and 13, a gate electrode 11aa provided on an insulating substrate 10, a gate insulating film 12 provided so as to cover the gate electrode 11aa, a semiconductor layer 13c provided on the gate insulating film 12 and having a channel region C such that the channel region C overlaps with the gate electrode 11aa, and a source electrode 14ba and the drain electrode 14cc provided on the semiconductor layer 13c such that the channel region C is exposed and arranged apart from each other.

Referring to FIGS. 12 and 13, in the TFT substrate 20c, a protection insulating film 16c is provided so as to cover each of the TFTs 5, and a plurality of pixel electrodes 17c are provided in a matrix on the protection insulating film 16c.

Referring to FIGS. 12 and 13, the drain electrode 14cc is provided apart from the capacitor line 11b as viewed in the plane, and an edge part of an opening 14cch formed in an end part of the drain electrode 14cc is connected to the pixel electrode 17c through a contact hole 16cha formed in the protection insulating film 16c. The pixel electrode 17c forms, referring to FIGS. 12 and 13, an auxiliary capacitor 6c in the state in which the pixel electrode 17c overlaps with the capacitor line 11b with an opening 16chb of the protection insulating film 16c and the gate insulating film 12 being interposed therebetween. The auxiliary capacitor 6c includes a fixed capacitor part in which the capacitor line 11b and the pixel electrode 17b overlap with each other with only the gate insulating film 12 and the protection insulating film 16c being interposed therebetween, and does not include a variable capacitor part having the MOS structure described in the first and second embodiments.

The TFT substrate 20c having the foregoing configuration can be manufactured in a manner that pattern shapes of, e.g., a source drain formation layer and a protection insulating film are changed from those of the manufacturing method described in the first embodiment.

As described above, according to the TFT substrate 20c and the manufacturing method thereof in the present embodiment, the pixel electrodes 17c are, as in the first and second embodiments, provided on the gate insulating film 12 covering the capacitor lines 11b. Unlike the first and second embodiments, the area of part of the semiconductor layer 13c overlapping with the capacitor line 11b with the gate insulating film 12 being interposed therebetween is zero. Thus, a change in electrical capacitance of the auxiliary capacitor 6c due to the semiconductor layer 13c can be reduced, and the area of the drain electrode 14cc made of a metal layer having light blocking properties can be reduced at each pixel. Consequently, an aperture ratio at each pixel can be increased.

In the present embodiment, the auxiliary capacitor 6c configured such that the pixel electrode 17c overlaps with the capacitor line 11b with the opening 16chb of the protection insulating film 16c and the gate insulating film 12 being interposed therebetween has been described as an example. However, the auxiliary capacitor may be, for example, configured such that the pixel electrode overlaps with the capacitor line 11b in the state in which a protection insulating film formed without the opening 16chb and the gate insulating film 12 are interposed between the pixel electrode and the capacitor line 11b.

<<Fourth Embodiment of the Invention>>

Figure 14:
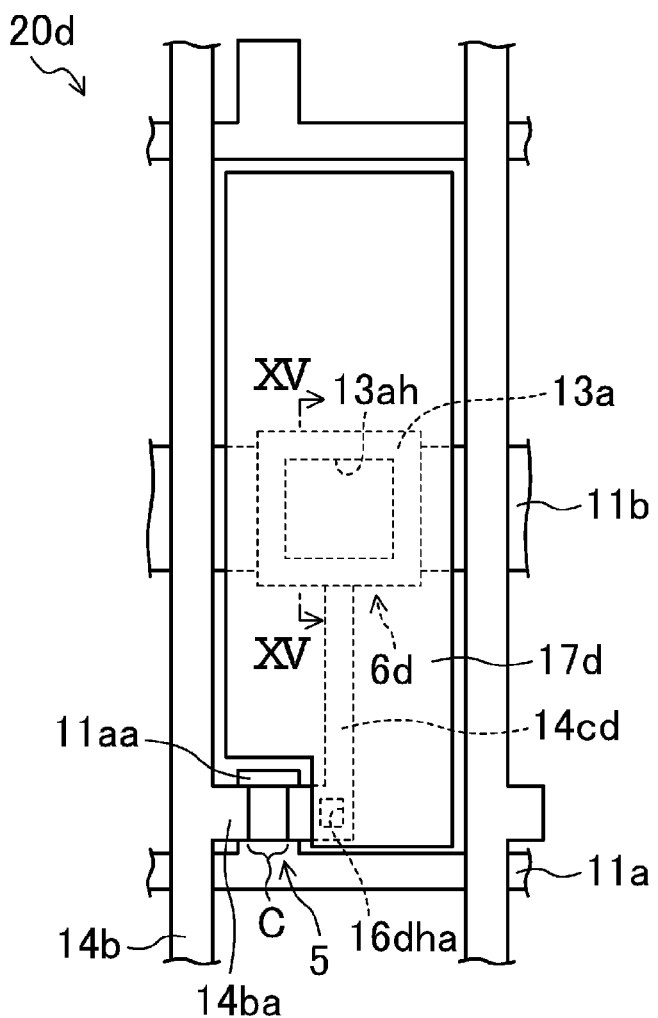
FIG. 14 is a plan view of a TFT substrate of a fourth embodiment.
Figure 15:
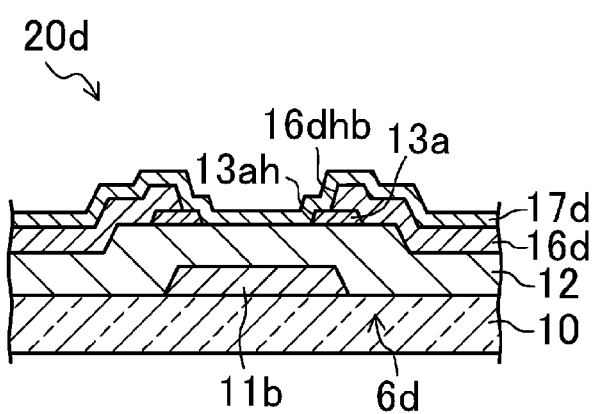
FIG. 15 is a cross-sectional view of the TFT substrate along a XV-XV line illustrated in FIG. 14.

FIG. 14 is a plan view of a TFT substrate 20d of the present embodiment. FIG. 15 is a cross-sectional view of the TFT substrate along a XV-XV line illustrated in FIG. 14.

In the foregoing embodiments, the TFT substrates 20a-20c in each of which the source and drain electrodes are stacked on the semiconductor layer have been described as examples. On the other hand, in the present embodiment, the TFT substrate 20d in which part of source and drain electrodes is not stacked on a semiconductor layer.

Specifically, in the TFT substrate 20d, each of TFTs 5 includes, referring to FIGS. 14 and 15, a gate electrode 11aa provided on an insulating substrate 10, a gate insulating film 12 provided so as to cover the gate electrode 11aa, a semiconductor layer 13a provided on the gate insulating film 12 and having a channel region C such that the channel region C overlaps with the gate electrode 11aa, and a source electrode 14ba and a drain electrode 14cd provided on the semiconductor layer 13a such that the channel region C is exposed and arranged apart from each other.

Referring to FIGS. 14 and 15, in the TFT substrate 20d, a protection insulating film 16d is provided so as to cover each of the TFTs 5, and a plurality of pixel electrodes 17d are provided in a matrix on the protection insulating film 16d.

Referring to FIGS. 14 and 15, not only the channel region C of the semiconductor layer 13a but also part of the semiconductor layer 13a overlapping with a capacitor line 11b are exposed through the drain electrode 14cd.

The drain electrode 14cd is, referring to FIG. 14, connected to the pixel electrode 17d through a contact hole 16dha formed in the protection insulating film 16d. Referring to FIGS. 14 and 15, the pixel electrode 17d forms an auxiliary capacitor 6d in the state in which the pixel electrode 17d overlaps with the capacitor line 11b with an opening 16dhb of the protection insulating film 16d, an opening 13ah of the semiconductor layer 13a, and the gate insulating film 12 being interposed therebetween. The auxiliary capacitor 6d includes a fixed capacitor part in which the capacitor line 11b and the pixel electrode 17d overlap with each other with only the gate insulating film 12 being interposed therebetween, and a variable capacitor part having a MOS structure in which the capacitor line 11b and the pixel electrode 17d overlap with each other with the gate insulating film 12 and the semiconductor layer 13a being interposed therebetween.

The TFT substrate 20d having the foregoing configuration can be manufactured in a manner that pattern shapes of, e.g., a drain electrode and a protection insulating film are changed from those of the manufacturing method described in the first embodiment.

According to the TFT substrate 20d of the present embodiment, the pixel electrode 17d is, as in each of the foregoing embodiments, provided on the gate insulating film 12 covering the capacitor line 11b, and therefore a change in electrical capacitance of the auxiliary capacitor 6d due to the semiconductor layer 13a can be reduced.

In each of the foregoing embodiments, the TFT substrate having the single pixel structure has been described as an example. However, the present invention is applicable to a TFT substrate having, e.g., a multi-pixel structure in which a control of the potential of pixel electrodes through auxiliary capacitors causes each pixel to serve as a light sub-pixel or a dark sub-pixel.

In each of the foregoing embodiments, the In—Ga—Zn—O based oxide semiconductor has been described as an example of the semiconductor layer. However, the present invention is applicable to, e.g., oxide semiconductors such as an In—Si—Zn—O based oxide semiconductor, an In—Al—Zn—O based oxide semiconductor, a Sn—Si—Zn—O based oxide semiconductor, a Sn—Al—Zn—O based oxide semiconductor, a Sn—Ga—Zn—O based oxide semiconductor, a Ga—Si—Zn—O based oxide semiconductor, a Ga—Al—Zn—O based oxide semiconductor, an In—Cu—Zn—O based oxide semiconductor, a Sn—Cu—Zn—O based oxide semiconductor, a Zn—O based oxide semiconductor, an In—O based oxide semiconductor, and an In—Zn—O based oxide semiconductor, and silicon semiconductors such as amorphous silicon and polysilicon.

In each of the foregoing embodiments, the gate line, the gate electrode, the capacitor line, the source line, the source electrode, and the drain electrode each having the multilayer structure have been described as examples. However, the gate line, the gate electrode, the capacitor line, the source line, the source electrode, and the drain electrode may each have a single layer structure.

In each of the foregoing embodiments, the gate insulating film and the protection insulating film each having the single layer structure have been described as examples. However, the gate insulating film and the protection insulating film may each have a multilayer structure.

In each of the foregoing embodiments, the TFT substrate in which the electrode of the TFT connected to the pixel electrode serves as the drain electrode has been described as an example. However, the present invention is applicable to a TFT substrate in which an electrode of a TFT connected to a pixel electrode serves as a source electrode.

INDUSTRIAL APPLICABILITY

As described above, according to the present invention, the change in electrical capacitance of the auxiliary capacitor due to the semiconductor layer can be reduced. Thus, the present invention is useful for the TFT substrate forming the liquid crystal display panel.

DESCRIPTION OF REFERENCE CHARACTERS

C Channel Region
Ra, Rb Resist Pattern
5 TFT
6a-6d Auxiliary Capacitor
10 Insulating Substrate
11aa Gate Electrode
11b Capacitor Line
12 Gate Insulating Film
13 Semiconductor Film
13a-13c Semiconductor Layer
14, 14a Metal Conductive Film
14ba Source Electrode
14ca-14cd Drain Electrode
14cah, 14cbh Opening (Non-Patterned Part)
15 Source Drain Formation Layer
16a-16d Protection Insulating Film
16ah, 16bh, 16cha, 16dha Contact Hole
17a-17d Pixel Electrode
20a-20d TFT Substrate
30 Counter Substrate
40 Liquid Crystal Layer
50 Liquid Crystal Display Panel

The invention claimed is:
1. A thin film transistor substrate, comprising:
a plurality of pixel electrodes provided in a matrix;
a plurality of thin film transistors each provided for a corresponding one of the pixel electrodes and connected to the corresponding one of the pixel electrodes; and
a plurality of auxiliary capacitors each provided for a corresponding one of the pixel electrodes, wherein
each of the thin film transistors includes:
    a gate electrode provided on a substrate,
    a gate insulating film provided so as to cover the gate electrode,
    a semiconductor layer provided on the gate insulating film and having a channel region such that the channel region overlaps with the gate electrode, and
    source and drain electrodes provided on the semiconductor layer and arranged apart from each other with the channel region being interposed therebetween, the channel region being exposed through the source and drain electrodes,
each of the auxiliary capacitors includes:
    a capacitor line made of a material identical to that of the gate electrode and provided in a layer identical to that of the gate electrode,
    the gate insulating film provided so as to cover the capacitor line, and
    a corresponding one of the pixel electrodes provided on the gate insulating film so as to overlap with the capacitor line and being in conduction with the drain electrode,
the drain electrode is provided so as to overlap with the capacitor line, and includes, in a portion overlapping with the capacitor line, a non-patterned portion through which the gate insulating film is exposed, and
each of the pixel electrodes is provided on the gate insulating film with the non-patterned portion being interposed therebetween.

2. The thin film transistor substrate of claim 1, wherein the non-patterned portion is an opening defined in the drain electrode.

3. The thin film transistor substrate of claim 1, wherein the semiconductor layer is made of an oxide semiconductor.

4. A method for manufacturing a thin film transistor substrate including:
a plurality of pixel electrodes provided in a matrix;
a plurality of thin film transistors each provided for a corresponding one of the pixel electrodes and connected to the corresponding one of the pixel electrodes; and
a plurality of auxiliary capacitors each provided for a corresponding one of the pixel electrodes, wherein
each of the thin film transistors includes:
a gate electrode provided on a substrate,
a gate insulating film provided so as to cover the gate electrode,
a semiconductor layer provided on the gate insulating film and having a channel region such that the channel region overlaps with the gate electrode, and
source and drain electrodes provided on the semiconductor layer and arranged apart from each other with the channel region being interposed therebetween, the channel region being exposed through the source and drain electrodes, the method comprising:
a gate layer formation step of forming the gate electrode and a capacitor line on the substrate;
a resist pattern formation step of forming, after the gate insulating film, a semiconductor film, and a metal conductive film are formed in this order so as to cover the gate electrode and the capacitor line, a resist pattern on a region of the metal conductive film where the channel region and the source and drain electrodes are to be formed such that a region to be the channel region is formed thinner;
a first etching step of etching a portion of the metal conductive film exposed through the resist pattern and a portion of the semiconductor film below the metal conductive film to form a source drain formation layer which is to be the channel region and the source and drain electrodes;
a second etching step of etching, after the resist pattern used in the first etching step is reformed in a manner that a thickness thereof is reduced such that a region of the source drain formation layer which is to be the channel region is exposed, a portion of the metal conductive film exposed through the reformed resist pattern to form the semiconductor layer having the channel region and the source and drain electrodes, thereby forming each of the thin film transistors;
a protection insulating film formation step of forming, after the resist pattern used in the second etching step is removed, a protection insulating film such that a contact hole reaching the drain electrode is formed and a portion overlapping the capacitor line is exposed; and
a pixel electrode formation step of forming each of the pixel electrodes on the protection insulating film such that the each of the pixel electrodes overlaps with the capacitor line with the gate insulating film being interposed therebetween, thereby forming a corresponding one of the auxiliary capacitors, wherein
in the second etching step, the drain electrode is formed so as to overlap with the capacitor line, and includes, in a portion overlapping with the capacitor line, a non-patterned portion through which the gate insulating film is exposed, and
in the pixel electrode formation step, the each of the pixel electrodes is formed on the gate insulating film with the non-patterned portion being interposed therebetween.

5. A liquid crystal display panel, comprising:
a thin film transistor substrate and a counter substrate provided so as to face each other; and
a liquid crystal layer provided between the thin film transistor substrate and the counter substrate, wherein
the thin film transistor substrate includes:
a plurality of pixel electrodes provided in a matrix,
a plurality of thin film transistors each provided for a corresponding one of the pixel electrodes and connected to the corresponding one of the pixel electrodes, and
a plurality of auxiliary capacitors each provided for a corresponding one of the pixel electrodes,
each of the thin film transistors includes:
a gate electrode provided on a substrate,
a gate insulating film provided so as to cover the gate electrode,
a semiconductor layer provided on the gate insulating film and including a channel region such that the channel region overlaps with the gate electrode, and
source and drain electrodes provided on the semiconductor layer and arranged apart from each other with the channel region being interposed therebetween, the channel region being exposed through the source and drain electrodes,
each of the auxiliary capacitors includes:
a capacitor line made of a material identical to that of the gate electrode and provided in a layer identical to that of the gate electrode,
the gate insulating film provided so as to cover the capacitor line, and
a corresponding one of the pixel electrodes provided on the gate insulating film so as to overlap with the capacitor line and being in conduction with the drain electrode,
the drain electrode is provided so as to overlap with the capacitor line, and includes, in a portion overlapping with the capacitor line, a non-patterned portion through which the gate insulating film is exposed, and
each of the pixel electrodes is provided on the gate insulating film with the non-patterned portion being interposed therebetween.

6. The thin film transistor substrate of claim 3, wherein the oxide semiconductor is an In—Ga—Zn—O based oxide semiconductor.

7. The method of claim 4, wherein the semiconductor film is made of an In—Ga—Zn—O based oxide semiconductor.

8. The liquid crystal display panel of claim 5, wherein the semiconductor layer is made of an In—Ga—Zn—O based oxide semiconductor.

* * * * *